Dec. 1, 1959 J. KURSHAN 2,915,646

SEMICONDUCTOR DEVICES AND SYSTEM

Filed Dec. 4, 1953

INVENTOR.
Jerome Kurshan

BY J. C. Whittaker
ATTORNEY

United States Patent Office 2,915,646
Patented Dec. 1, 1959

2,915,646

SEMICONDUCTOR DEVICES AND SYSTEM

Jerome Kurshan, Princeton, N.J., assignor to Radio Corporation of America, a corporation of Delaware Application December 4, 1953, Serial No. 396,185
6 Claims. (Cl. 307—88.5)

This invention relates to semiconductor devices and particularly to multi-electrode semiconductor devices and systems in which they may be employed.

One type of semiconductor device is known as a transistor and comprises a body of semiconductor material of one type of conductivity having at least two rectifying electrodes in operative relation therewith. The rectifying electrodes may comprise point or line contact electrodes or P–N junction electrodes. P–N junctions comprise zones of N-type and P-type conductivity material separated by rectifying barriers which have high resistance to electrical current flow in one direction and low resistance to such flow in the reverse direction.

In these devices, one of the rectifying electrodes is operated as an emitter electrode and injects minority charge carriers into the semiconductor body, said carriers being collected by the other rectifying electrode which is operated as a collector electrode. A base electrode is generally connected in ohmic contact with the semiconductor body or crystal which is suitably biased electrically with respect to the emitter and collector electrodes.

Ordinarily, in transistors, the flow of electrical charge carriers from the emitter to the collector occurs by a process of diffusion as a result of which the charge transit times are comparatively non-uniform and the transit paths of the charges are spread out in the semiconductor crystal. Some of the charge carriers are lost completely due to recombination. This effect is noted also when charges drift in an applied electric field. Thus, the gain and frequency response of such transistors are reduced.

Accordingly, an important object of this invention is to provide a semiconductor device of new and improved form.

A further object is to provide an improved multi-electrode semiconductor device.

An additional object is to provide novel means for operating an improved semiconductor device in accordance with the invention.

Another object is to provide an improved semiconductor device having improved gain and frequency response.

Still another object is to provide a semiconductor device and system having improved means for controlling the flow of charge carriers within the body of the device.

In general, the purposes and objects of this invention are accomplished by a semiconductor body having a base electrode, emitter and collector rectifying electrodes preferably in contact with the same surface of the body, and at least one properly shaped and positioned auxiliary electrode for controlling the flow of current between the emitter and collector electrodes.

The invention is described in greater detail by reference to the drawing wherein.

Similar elements are designated by similar reference characters throughout the drawing.

Figures 1, 2, 5, 6, 7:
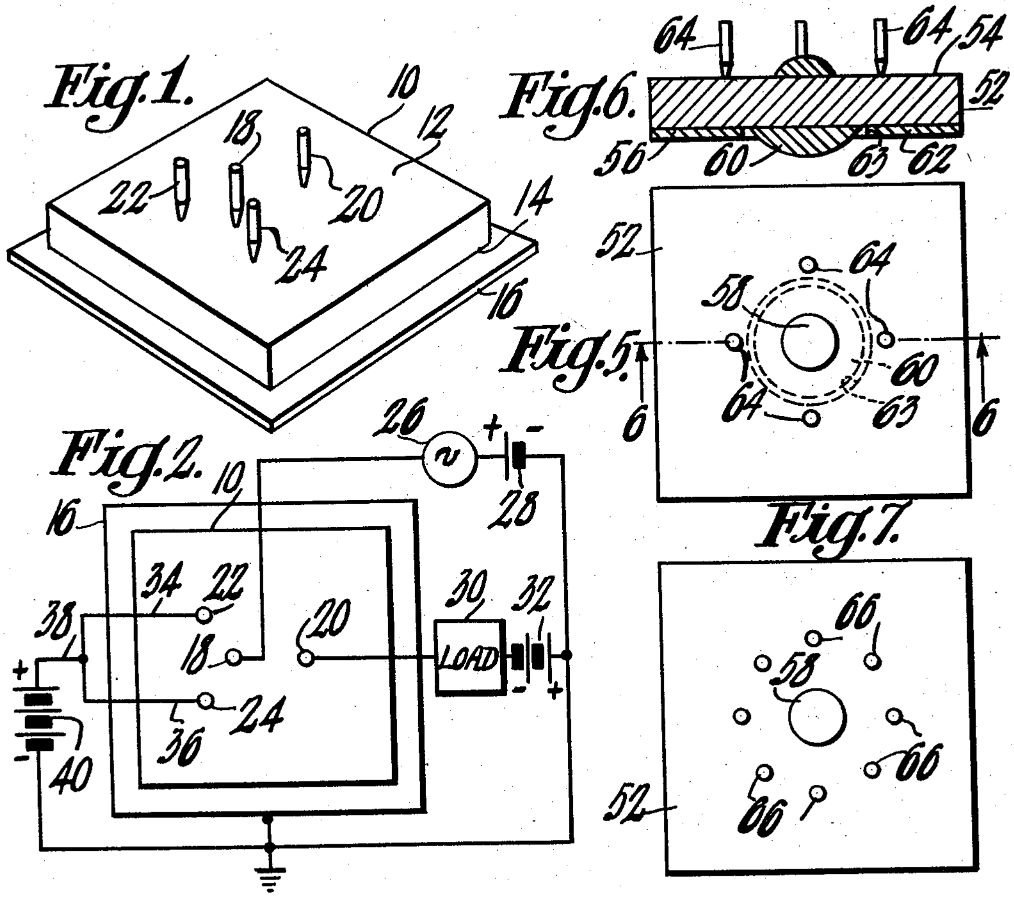
Fig. 1 is a perspective view of a device embodying the principles of the invention.
Fig. 2 is a plan view of the device of Fig. 1 and a circuit in which it may be operated.
Fig. 5 is a plan view of another modification of the invention.
Fig. 6 is a sectional view along the line 6—6 in Figure 5.
Fig. 7 is a plan view of an alternative arrangement of the electrodes of the device shown in Fig. 5.

Referring to Figure 1, a device embodying the principles of the invention comprises a body or crystal 10 of semiconductor material, for example germanium or silicon, of N-type or P-type conductivity. The semiconductor body or crystal will henceforth be described as N-type germanium which may be in the form of a disk or plate preferably having two substantially plane parallel surfaces 12 and 14. The body is provided with a base electrode 16 which is soldered or otherwise bonded in ohmic contact with one surface, e.g. 14 thereof. The electrode 16 may comprise a small tab or a comparatively large area plate which may cover all or a portion of the surface 16 of the crystal 10. A pair of rectifying electrodes 18 and 20 are provided on the opposite surface 12 of the crystal and are operated in the completed device as emitter and collector electrodes respectively. The emitter 18 and collector 20 may be small area, e.g. point-contact, rectifying electrodes, or they may be P–N junction type electrodes.

If P–N junction electrodes are employed they may be formed for example, by an alloying process described in a copending U.S. patent application of C. W. Mueller, Serial No. 295,304, filed June 24, 1952 and assigned to the assignee of this application. According to the method described in said application and to form a P–N–P transistor, disks or pellets of a so-called impurity material, for example indium, are placed in contact with the surface 12 of the block 10 of N-type germanium. The assembly of block and pallets is heated in an atmosphere of hydrogen at a temperature sufficient to cause the pallets of impurity material to melt and alloy with the germanium block to form the P–N junctions. These P–N junction electrodes formed by the alloying process include rectifying barriers, thin layers of P-type material and regions which comprise alloys of indium and germanium and which do not have semiconductor properties.

With a body of N-type germanium, the impurity material alloyed therewith may comprise one or more acceptor substances such as indium, aluminum, gallium, boron or zinc. If the semiconductor body is of P-type germanium, the impurity material alloyed therewith may comprise one or more donor substances such as arsenic, bismuth, antimony, sulfur, selenium, tellurium or phosphorus.

According to the invention, an auxiliary electrode arrangement is provided for controlling the flow of charge carriers from the emitter to the collector by a type of focusing action. The auxiliary electrode arrangement may take many forms. For example, referring to Figures 1 and 2, the auxiliary or focusing electrode arrangement comprises a pair of electrodes 22 and 24 positioned on either side of and somewhat more remote from the collector electrode 20 than is the emitter electrode 18. These auxiliary electrodes may be in non-rectifying or ohmic contact with the crystal 10, or they may be rectifying electrodes of the point-contact or P–N junction types. For purposes of illustration only, point contact electrodes are shown in Figure 1.

For operation of the device as an amplifier, and referring to Figure 2, the emitter electrode 18 is connected through an input signal source 26 to the positive terminal of a first battery 28, the negative terminal of which is connected to the base electrode 16 (ground). The emitter is thus properly biased in the forward direction with respect to the crystal 10. The collector electrode 20 is connected through a load device 30, for example, a load resistor to the negative terminal of a second battery 32, the positive terminal of which is connected to the base electrode (ground). The collector electrode 20 is thus biased in the reverse direction with respect to the crystal 10.

To provide the desired control or focusing action, the auxiliary or focusing electrodes 22 and 24 are connected together by leads 34 and 36 and are biased in the forward direction with respect to the crystal 10 by a common lead 38 connected to the positive terminal of a third battery 40, the negative terminal of which is connected to the base electrode (ground). The bias voltage on the electrodes 22 and 24 should be equal to or greater than the bias voltage on the emitter 18, both with respect to the base electrode (ground).

In operation of the device shown in Figures 1 and 2, the emitter electrode 18 injects minority charge carriers, in this case holes, into the crystal 10 under the influence of the input signal from the source 26. Ordinarily, these carriers flow away from the emitter in all directions with a number of them reaching the collector electrode 20 over paths through the crystal of different lengths. However, the focusing electrodes 22 and 24 also inject holes into the crystal and these latter holes increase the concentration of holes in the vicinity of the emitter and in the vicinity of the current flow path between the emitter and the collector. These holes injected by the focusing electrodes repel the emitter-injected holes and effectively focus the emitter holes into a comparatively narrow path directed primarily toward the collector. This explanation of the operation of the invention generally prevails for operation at low and high signal and focusing currents. At high currents, however, the electric field established in the body by the voltages applied to the focusing electrodes 22 and 24 enhance the focusing effect caused by minority charge carrier concentration. Thus, non-rectifying electrodes may more conveniently be used at high current operation where the electric field due to such positively biased electrodes provides the desired focusing action.

Figure 3:
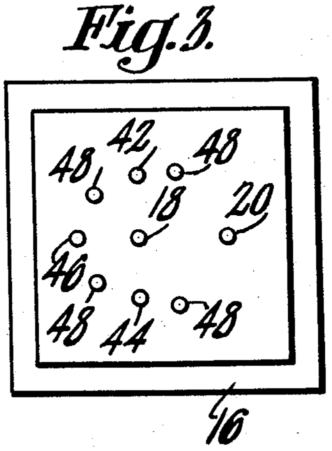
Fig. 3 is a plan view of an alternative arrangement of electrodes of a device comprising another embodiment of the invention.

Referring to Figure 3, a modified arrangement for focusing minority charge carriers from the emitter 18 to the collector 20, includes focusing electrodes 42 and 44 on either side of and substantially aligned with the emitter 18. To enhance the focusing effect, an additional electrode 46 may be provided behind the emitter and in line with the emitter-to-collector current path. A plurality of other electrodes 48 may be positioned around the emitter 18 to further increase the focusing action. The electrodes 42, 44, 46 and 48 may be either rectifying or nonrectifying electrodes, all biased positively with respect to the base electrode 16 as explained heretofore by reference to Figure 2.

Figure 4:
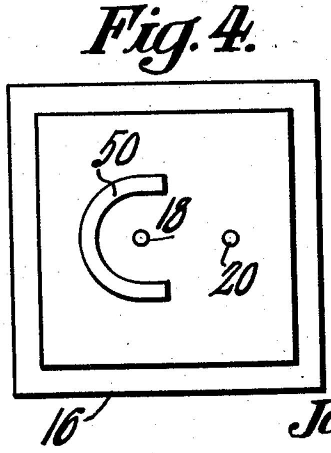
Fig. 4 is a plan view of a further modification of the invention.

Referring to Figure 4, the focusing action may also be achieved by means of a suitably shaped focusing plate, for example a crescent-shaped plate 50, positioned adjacent to and surrounding the emitter electrode. The plate 50 may be in rectifying or nonrectifying contact with the semiconductor crystal, and is biased positively with respect to the base electrode as explained heretofore by reference to Figures 2 and 3.

The principles of the invention may also be applied to a transistor having emitter and collector rectifying electrodes disposed substantially concentrically on opposite surfaces of a semiconductor crystal. The rectifying electrodes may be small area or P–N junction electrodes.

Referring to Figures 5 and 6, such a device comprises a semiconductor crystal 52 having two substantially plane and parallel surfaces 54 and 56. An emitter rectifying electrode 58 is in operative relation with one surface, e.g. 54, thereof, and a collector rectifying electrode 60 is in operative relation with the opposite surface 56 substantially axially aligned with the emitter electrode. These rectifying electrodes may be P–N junction electrodes as shown or they may be of the small-area point or line contact type. A base electrode 62 is soldered in ohmic contact to the crystal 52. The base electrode may comprise an annular metal plate having an opening 63 surrounding the collector 60 on the surface 56 or it may be disposed surrounding electrodes positioned on the surface 54. The base electrode may also comprise a metal tab soldered to the crystal.

In accordance with the invention, a charge-focusing means comprising a plurality of electrodes 64 is provided in the vicinity of the emitter electrode and on the same surface of the crystal as the emitter. In this embodiment of the invention, four electrodes 64 are spaced uniformly about the emitter. These electrodes may be point contact, P–N junction or non-rectifying electrodes. As described above, these focusing electrodes are biased in the same polarity as the emitter electrode and thus focus the charge carriers into a path between the emitter and the collector.

Figure 8:
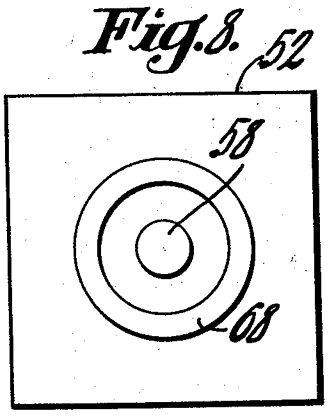
Fig. 8 is a plan view of a further alternative arrangement of the electrodes of the device shown in Fig. 5.

Referring to Figure 7, the focusing means may comprise a plurality of electrodes 66 disposed around the emitter electrode in a substantially uniform array. Referring to Figure 8, the focusing means may also comprise an annular electrode 68 surrounding the emitter electrode and in either ohmic or rectifying contact with the semiconductor crystal.

It is to be understood that a P-type body or crystal may be employed wherever an N-type crystal has been shown, in which case emitter and collector polarities and the like would be reversed.

What is claimed is:

1. A semiconductor device comprising a semiconductor body, a plurality of rectifying electrodes in contact with said body, one of said electrodes having a rectifying region associated therewith and being adapted to function as an emitter of minority charge carriers, another of said electrodes being adapted to function as a collector of said charges thus to provide a current flow path for said charges between said emitter and collector, and a third generally semicircular rectifying electrode positioned on said body on the same surface as and partially surrounding said emitter electrode, said rectifying electrodes being separated from one another by rectifying barriers.

2. A semiconductor device comprising a semiconductor body, a pair of rectifying electrodes in operative relation with said body and defining the ends of a current flow path, one of said electrodes being adapted to function as an emitter of minority charge carriers, the other of said electrodes being adapted to function as a collector of said charges from said emitter, and at least two other electrodes in operative relationship with said emitter electrode positioned adjacent to said path and in nonrectifying contact and biased in the forward direction with respect to said body, with one electrode on either side of said path.

3. A semiconductor system comprising a semiconductor body, an emitter electrode in contact with said body, a collector electrode in contact with said body, said electrodes defining the terminals of a current flow path, and a charge-focusing means in contact with said body and disposed laterally of said current flow path, said emitter electrode being biased in the forward direction with respect to said body, said collector electrode being biased in the reverse direction with respect to said body, said focusing means being biased in the forward direction with respect to said body.

4. A semiconductor system comprising a semiconductor body, an emitter electrode in contact with said body, a collector electrode in contact with said body, said electrodes defining the terminals of a current flow path, and a charge-focusing means in contact with said body and disposed laterally of said current flow path, said emitter electrode being biased in the forward direction with respect to said body, said collector electrode being biased in the reverse direction with respect to said body, said focusing means being biased in the forward direction with respect to said body at a potential no smaller than that of said emitter electrode.

5. A semiconductor device comprising a semiconductor body having a pair of opposed major surfaces, an emitter rectifying electrode having a rectifying region associated therewith disposed in one of said surfaces, a collector rectifying electrode disposed in the opposed surface of said body and spaced from said emitter electrode, said rectifying electrodes being aligned along a common axis perpendicular to one of said major surfaces, a base electrode in ohmic contact with said body, and a focusing electrode on the same surface of said body as said emitter electrode and separated from said emitter electrode and said collector electrode by rectifying barriers.

6. A semiconductor device comprising a semiconductor body having a pair of opposed major surfaces, an emitter rectifying electrode disposed in one of said surfaces and biased in the forward direction with respect to said body, a collector rectifying electrode disposed in the opposed surface and biased in the reverse direction with respect to said body, said rectifying electrodes being aligned along a common axis perpendicular to one of said major surfaces, a base electrode in ohmic contact with said body, and a plurality of focusing electrodes disposed about said emitter electrode and electrically biased in the forward direction with respect to said body.

References Cited in the file of this patent

UNITED STATES PATENTS

| | | |
|---|---|---|
| 2,476,323 | Rack | July 19, 1949 |
| 2,524,035 | Bardeen et al. | Oct. 3, 1950 |
| 2,561,411 | Pfann | July 24, 1951 |
| 2,586,080 | Pfann | Feb. 19, 1952 |
| 2,672,528 | Schockley | Mar. 16, 1954 |
| 2,679,619 | Grassl | May 25, 1954 |